United States Patent

Huai et al.

[11] Patent Number: 6,137,662
[45] Date of Patent: Oct. 24, 2000

[54] MAGNETORESISTIVE SENSOR WITH PINNED SAL

[75] Inventors: Yiming Huai, Pleasanton; Daniel Nepela, San Jose; Durga Ravipati, Saratoga; Marcos Lederman, San Francisco, all of Calif.

[73] Assignee: Read-Rite Corporation, Milpitas, Calif.

[21] Appl. No.: 09/055,730

[22] Filed: Apr. 7, 1998

[51] Int. Cl.[7] ....................................................... G11B 5/39
[52] U.S. Cl. ..................................... 360/327.22; 360/324
[58] Field of Search .................................... 360/113, 314, 360/315, 324, 324.11, 327.22; 338/32 R; 324/207.21

[56] References Cited

U.S. PATENT DOCUMENTS

| | | | |
|---|---|---|---|
| 5,492,720 | 2/1996 | Gill et al. | 427/131 |
| 5,508,866 | 4/1996 | Gill et al. | 360/327.2 |
| 5,705,973 | 1/1998 | Yuan et al. | 338/32 R |
| 5,715,120 | 2/1998 | Gill | 360/113 |
| 5,923,505 | 7/1999 | Kroes et al. | 360/113 |

FOREIGN PATENT DOCUMENTS 8-36715  2/1996  Japan .

OTHER PUBLICATIONS

M. Uneno and S. Tanoue, "Properties of the Magnetoresistive Elements for NiFe/Cu Multilayers Using the SAL Biasing Method", J. of the Magnetics Society of Japan (in Japanese), vol. 19; pp. 401–404, (1995).

*Primary Examiner*—William R. Korzuch
*Attorney, Agent, or Firm*—Nathan N. Kallman

[57] ABSTRACT

A magnetoresistive sensor including a magnetoresistive (MR) sensing element, a nonmagnetic layer ("spacer") contacting the magnetoresistive sensing element; a first antiferromagnetic (AFM) layer contacting the nonmagnetic layer such that the nonmagnetic layer is sandwiched between the magnetoresistive sensing element and the antiferromagnetic layer; a ferromagnetic soft adjacent layer (SAL) contacting the antiferromagnetic layer such that the antiferromagnetic layer is sandwiched between the nonmagnetic layer and the soft adjacent layer; and a second antiferromagnetic layer contacting the SAL such that the SAL is sandwiched between the first and second antiferromagnetic layers. The two antiferromagnetic layers provide a stronger pinning effect. In one embodiment of the invention, the magnetoresistive sensing element is an anisotropic magnetoresistive (AMR) sensing element comprising a soft ferromagnetic layer. In another embodiment of the invention, the magnetoresistive sensing element is giant magnetoresistive (GMR) sensing element comprising a plurality of layers. The bias scheme can be non-symmetric, or may be symmetric around the magnetoresistive sensing element. An exchange biased bilayer (AFM/SAL) can have a multilayered structure such as AFM/SAL/AFM/SAL. . . . In this configuration, the SAL layer can be thin, so that a high exchange field with a high resistance can be obtained.

3 Claims, 3 Drawing Sheets

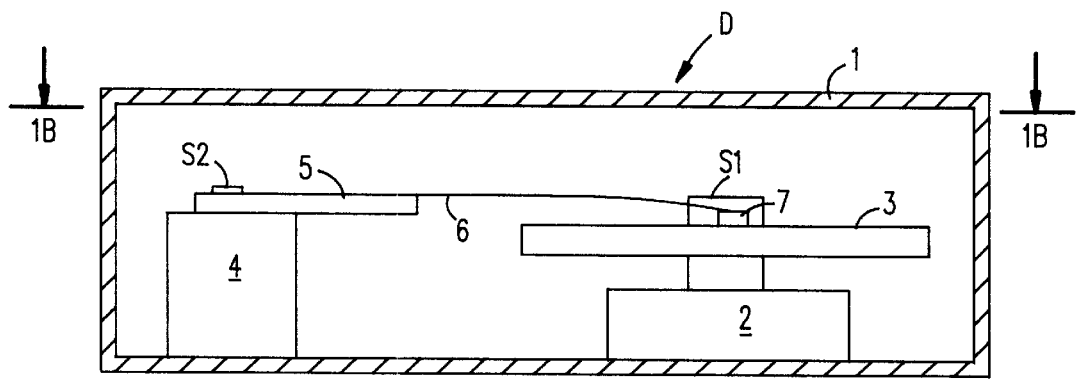
FIG. 1A PRIOR ART
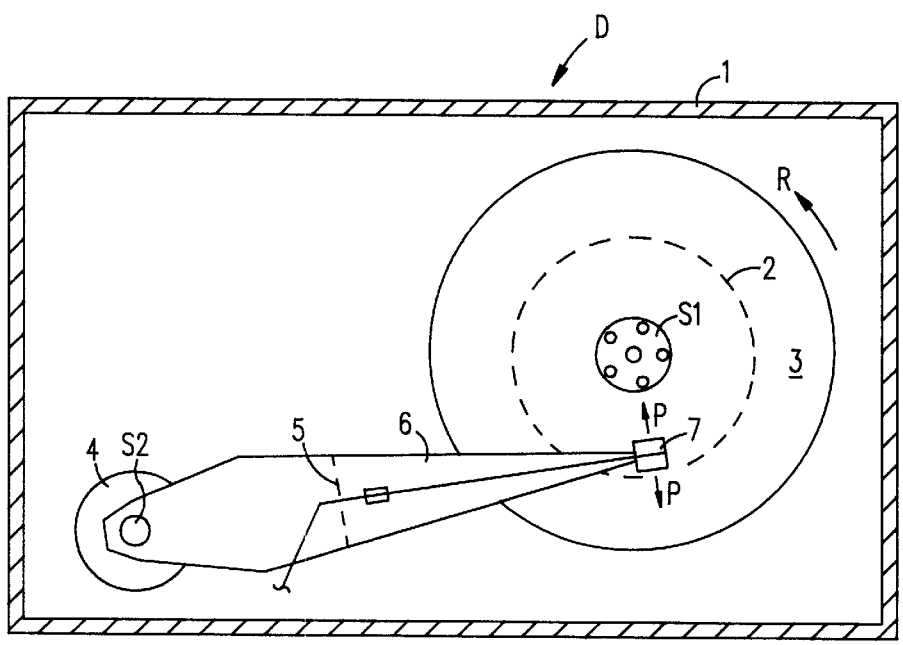
FIG. 1B PRIOR ART
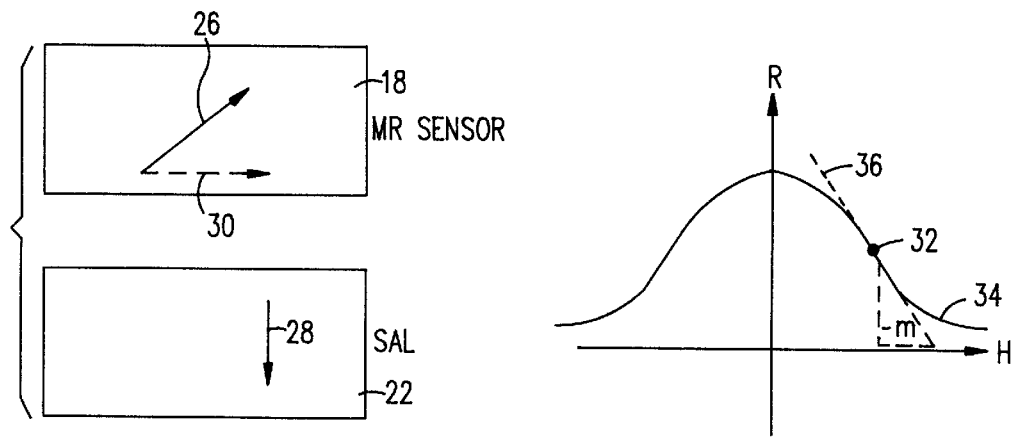
FIG. 3 PRIOR ART
FIG. 4 PRIOR ART

MAGNETORESISTIVE SENSOR WITH PINNED SAL

BACKGROUND OF THE INVENTION

This invention relates generally to magnetoresistive (MR) read heads, and more particularly to methods and apparatus for providing a SAL bias for a MR sensing element.

Magnetic disk drives are used to store and retrieve data for digital electronic apparatus such as computers. In FIGS. 1A and 1B, a magnetic disk drive D of the prior art includes a sealed enclosure 1, a disk drive motor 2, a magnetic disk 3, supported for rotation by a spindle S1 of motor 2, an actuator 4 and an arm 5 attached to a spindle S2 of actuator 4. A suspension 6 is coupled at one end to the arm 5, and at its other end to a read/write head or transducer 7. The transducer 7 is typically an inductive write element with a sensor read element. As the motor 2 rotates the disk 3, as indicated by the arrow R, an air bearing is formed under the transducer 7 to lift it off the surface of the disk 3. Various magnetic "tracks" of information can be read from the magnetic disk 3 as the actuator 4 is caused to pivot in a short arc as indicate by the arrows P. The design and manufacture of magnetic disk drives is well known to those skilled in the art.

A magnetoresistive (MR) sensor is used to detect magnetic field signals by means of a changing resistance in a read element. A conventional MR sensor utilizes the anisotropic magnetoresistive (AMR) effect for such detection, where the read element resistance varies in proportion to the square of the cosine of the angle between the magnetization in the read element and the direction of a sense current flowing through the read element. When there is relative motion between the MR sensor and a magnetic medium (such as a disk surface), a magnetic field from the medium causes a change in the direction of magnetization in the read element, thereby causing a corresponding change in resistance of the read element. The change in resistance can be detected to recover the recorded data on the magnetic medium.

MR sensors exhibit a number of desirable characteristics. For example, an MR sensor exhibits good linear density resolution and has an output signal strength that is independent of the relative velocity between sensor and medium.

In order for an MR sensor to operate properly, two bias fields are generally required, namely a longitudinal bias field and a transverse bias field. The longitudinal bias is used to suppress Barkhausen noise which is generated by multi-domain activities within the MR element and to improve the magnetic stability in the presence of high magnetic field excitation. The transverse bias field is used to bias the MR material so that its response to a magnetic field is in a linear range and of a high differential magnitude.

The transverse bias field is normal to the plane of the magnetic media and parallel to the surface of the planar MR element, and is usually provided by a layer of soft magnetic material deposited proximate to the MR element and magnetized by a magnetic field generated by a current flow in the MR element. The soft magnetic material is often referred to as a "Soft Adjacent Layer" or "SAL" and, as such, this form of biasing is often referred to as "SAL biasing." The SAL of the prior art is separated from the MR element by a thin nonmagnetic layer.

MR sensors using a SAL for transverse bias often exhibit magnetic instability in the sensor end or tail region and significant side-track reading. For high density storage, the height of the MR element is relatively small, e.g. less than 1 micrometer (um). For element dimensions in this range, it may not be possible to fully saturate the soft magnetic layer and therefore it may not provide an adequate transverse bias field to the MR sensor. For certain structural configurations, the unsaturated soft magnetic layer may also cause Barkhausen noise in the sensor. What is needed then, is a method for stabilizing the soft magnetic layer and insuring that it is saturated.

One method for achieving the above-stated goal is the use of the phenomenon of exchange anisotropy. It occurs as a result of the interaction of a ferromagnetic material in contact with an antiferromagnetic material, and can be described in terms of an exchange interaction between magnetic moments on each side of the interface between the two materials. For example, exchange coupling between thin layers of ferromagnetic nickel-iron (NiFe) and antiferromagnetic iron-manganese (FeMn) produces a unidirectional anisotropy. Improved transverse bias schemes for AMR sensors in which a SAL is stabilized by exchange coupling to an antiferromagnetic (AF) layer was proposed by Hardayal S. Gill et al. in U.S. Pat. No. 5,508,866.

Another form of magnetoresistance is referred to as giant magnetoresistance (GMR) which has been observed in a variety of magnetic multilayered structures. GMR sensors include at least two ferromagnetic metal layers separated by a non-ferromagnetic metal layer, and often include multiple such layers. For example, the GMR effect has been found in a variety of systems, such as Fe/Cr or Co/Cu multilayers. With GMR, the application of an external magnetic field causes a variation in the relative orientation of the magnetizations of neighboring ferromagnetic layers which, in turn, influences a change in the spin dependent scattering of conduction electrons and thus the electrical resistance of the structure. The resistance of the structure therefore changes as the relative alignment of the magnetizations of the ferromagnetic layers changes. A CIP GMR ML sensor provides a "current-in-plane" (CIP) sensing current as is well known to those skilled in the art.

In FIG. 1C, a shielded magnetoresistive head (MRH) 10 includes a first shield 12, a second shield 14, and a MR sensor 16 disposed within a gap (G) between shields 12 and 14. The MR sensor may be centered in the gap G, or may be offset to provide a self-bias, as is well known to those skilled in the art. Lines of magnetic flux impinging upon the MR sensor to create a detectable change in resistance. An air bearing surface S is defined by the MRH 10. For the purpose of this discussion, the MR sensor can be an AMR sensor or a GMR sensor. The design and manufacture of magnetoresistive heads, such as MRH 10, is well known to those skilled in the art.

In FIG. 2 a cross-sectional view taken along line 2—2 of FIG. 1C illustrates the structure of a MR sensor 16 of the prior art. The MR sensor 16 includes an MR sensing element 18, a spacer layer 20, a SAL layer 22, and antiferromagnetic (AFM) layer 24. Again, the MR element 18 can be either an AMR element or a GMR element. The SAL layer is typically made from a high resistivity, soft ferromagnetic material such as doped Permalloy. As is well known to those skilled in the art, Permalloy is a magnetic material nominally including 81% nickel (Ni) and 19% iron (Fe). The spacer layer 20 is typically a nonmagnetic metal such as tantalum for AMR, and copper for GMR. The AFM layer 24 is used to set the magnetic direction of the SAL 22, as will be discussed in greater detail below.

As is also seen in FIG. 2, the MR sensor 16 is supported by a substrate 17 and a buffer layer 19. Ferromagnetic end regions 21 abut the ends of the sensor 16. Leads 25, typically made from gold or other low resistance material, bring the current to the sensor 16. A capping layer 27 is provided over the AFM layer 24. A current source 29 provides a current $I_b$ to flow through the various layers of the sensor 16, and signal detection circuitry 31 detects changes in resistance of the sensor 16 as it encounters magnetic fields.

The purpose of the SAL 22 will be discussed with reference to FIGS. 3 and 4. In FIG. 3, the MR element 18 can have a total magnetization as illustrated by the arrow 26, while the SAL 22 is magnetized as indicated by the arrow 28. Absent the magnetic coupling of the SAL, the MR sensor may have a magnetization as indicated by the dashed arrow 30. The actual magnetic angle 26 is the sum of the magnetic angle 30 and the magnetostatically coupled magnetic field 28 of the SAL.

As seen in FIG. 4, the magnetization 28 of the SAL 22 at a right angle to the magnetization 30 of the MR element 18 biases the free element to a point 32 (with a 45° angle) on a R vrs. H curve 34 that is relatively linear as indicated by the dashed line 36, and which has a relatively large slope m. Linearity is, of course, desirable to provide a linear response, and the relatively large slope is desirable in that it produces large resistance changes in response to the changes in the magnetic field.

The SAL biasing method has a shortcoming in that a relatively high current (e.g. $>10^7$ amp/cm$^2$) is needed to saturate the SAL to obtain an adequate biasing level. This becomes very pronounced as the height of the AMR element is reduced to 1 micron or less. Additionally, as noted previously, AMR sensors using a SAL transverse bias often exhibit magnetic instability in the sensor or tail region and significant side-track reading. Further, for GMR ML, GMR magnitude was observed to decrease with increasing sense current due to a rise in the temperature of the sensor elements and, therefore, GMR must be optimized for a realistic sense current.

SUMMARY OF THE INVENTION

In the present invention, an improved exchange coupled SAL transverse bias scheme is used to bias AMR and CIP GMR ML sensors. More particularly, for AMR sensors, the SAL is made from a soft magnetic material with a high magnetic moment, and is separated from the magnetoresistive element by a spacer layer.

It will therefore be appreciated that a magnetoresistive sensor in accordance with the present invention includes a magnetoresistive sensing element, a nonmagnetic layer ("spacer") contacting the magnetoresistive sensing element; an antiferromagnetic (AFM) layer contacting the nonmagnetic layer such that the nonmagnetic layer is sandwiched between the magnetoresistive sensing element and the antiferromagnetic layer; and a ferromagnetic soft adjacent layer (SAL) contacting the antiferromagnetic layer such that the antiferromagnetic layer is sandwiched between the nonmagnetic layer and the soft adjacent layer. In one embodiment of the invention, the magnetoresistive sensing element is a magnetoresistive (AMR) sensing element comprising a soft ferromagnetic layer. In another embodiment of the invention, the magnetoresistive sensing element is giant magnetoresistive (GMR) sensing element comprising a plurality of layers.

The material of the soft adjacent layer is preferably made from NiFeRh, NiFeNb or a Co-based alloy. The material of the antiferromagnetic layer is preferably made from FeMn, RhMn, IrMn, NiO or NiCoO. The nonmagnetic layer is preferably made from Ti or Ta. The bias scheme can be non-symmetric, or may be symmetric around the magnetoresistive sensing element. Furthermore, a second antiferromagnetic layer can be provided to be a second pinning layer for the "pinned" SAL layer.

The exchange biased bilayer (AFM/SAL) can further have a multilayered structure such as AFM/SAL/AFM/SAL. . . . In this configuration, the SAL layer can be thin, so that a high exchange field with a high resistance can be obtained.

An advantage of this structure is that the provision of pinning layers on both sides of the pinned layer results in the strengthening of the pinning of the pinned layer. Furthermore, the symmetric and multiple-layer configurations provide a more uniform bias field and a large bias magnitude at the price of some additional fabrication complexity.

These and other advantages of the present invention will become apparent to those skilled in the art upon a reading of the following descriptions of the invention and a study of the several figures of the drawing.

BRIEF DESCRIPTION OF THE DRAWINGS

FIG. 1A is a partially sectioned, front elevational view of a magnetic disk drive assembly;

FIG. 1B is a cross section taken along line 1B—1B of FIG. 1A;

FIG. 3 illustrates the magnetization of the magnetoresistive MR sensing element and of the soft adjacent layer (SAL) of the MR sensor of FIG. 2;

FIG. 4 is a graph illustrating the resistance versus magnetic field relationship of the MR sensor;

DETAILED DESCRIPTION OF THE PREFERRED EMBODIMENTS

Figure 1C:
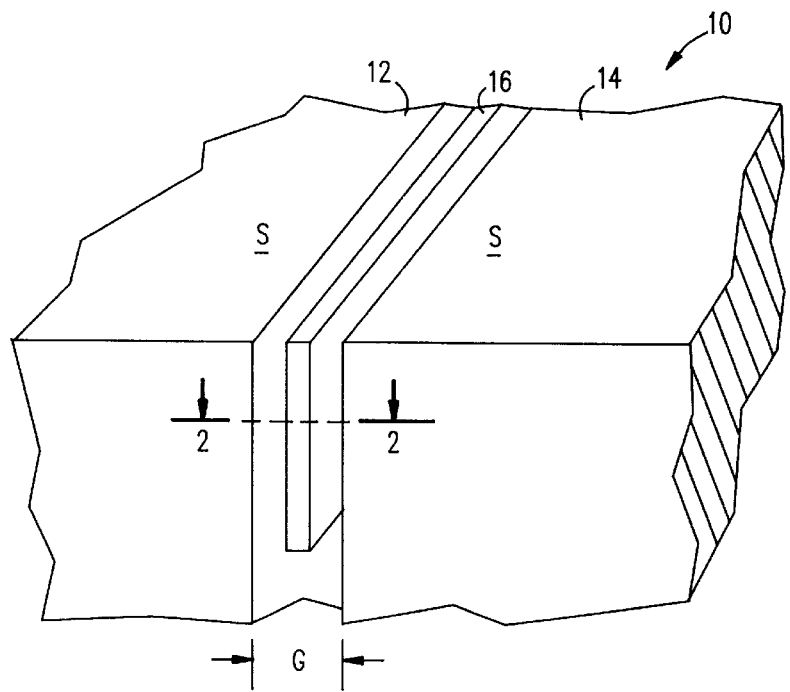
FIG. 1C is a perspective view of a prior art shielded vertical magnetoresistive (MR) read head.
Figure 2:
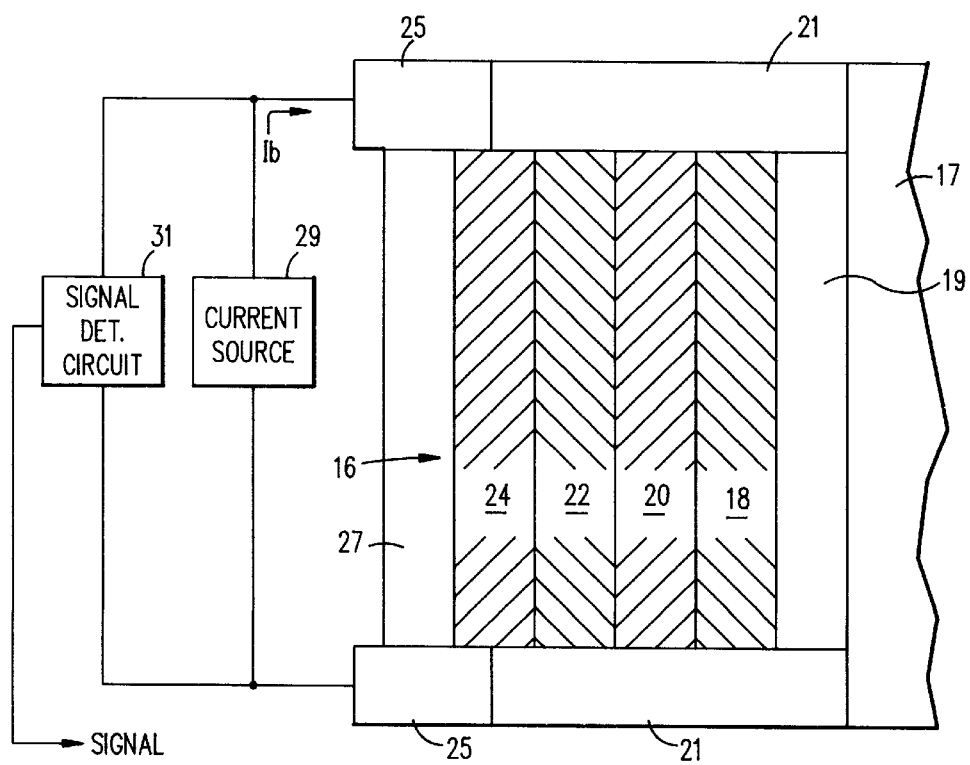
FIG. 2 is a cross-sectional view of the magnetoresistive (MR) sensor taken along line 2—2 of FIG. 1C.
Figure 5:
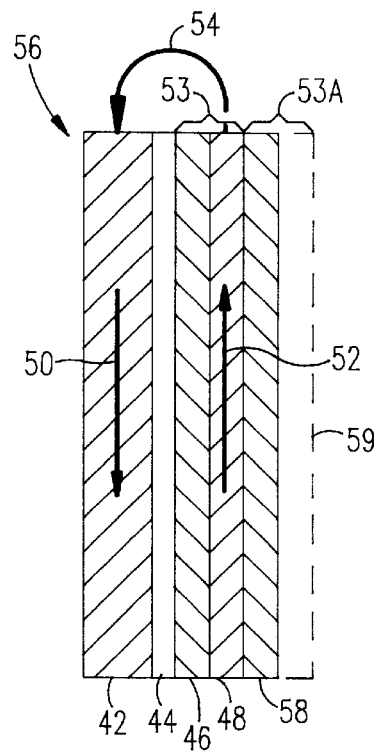
FIG. 5 is a cross section view of an improved MR sensor of the present invention having an exchange biased bilayer of an AFM layer and a SAL layer in a non-symmetrical arrangement with the MR sensing element and a second AFM layer abutting the exchange biased bilayer.

FIGS. 1, 2, 3, and 4 were discussed with reference to the prior art. In FIG. 5, a magnetoresistive (MR) sensor 56 includes a magnetoresistive (MR) sensing element 42, a nonmagnetic layer ("spacer") 44, an antiferromagnetic (AFM) or "pinning" layer 46, a soft adjacent layer (SAL) or "pinned" layer 48, and a second AFM layer 58. This second AFM layer 58 provides an additional "pinning" layer for the "pinned" SAL layer 48, which results in a stronger pinning of the SAL layer. This MR sensor 56 (and the other MR sensors of the present invention described subsequently) preferably form a part of the larger structure and system as illustrated in FIG. 2, where the MR sensors (such as MR sensor 56) of the present invention take the place of the MR sensor 16 of the prior art.

The nominal direction of the magnetic field in the MR sensing element 42 is indicated by arrow 50, while the pinned direction of the magnetic field in the SAL layer is indicated by arrow 52. The fringing field from the pinned SAL is indicated by arrow 54.

It will therefore be appreciated that a magnetoresistive sensor in accordance with the present invention includes a magnetoresistive sensing element 42, a nonmagnetic layer 44 contacting the magnetoresistive sensing element 42; an antiferromagnetic layer 46 contacting the nonmagnetic layer 44 such that the nonmagnetic layer 44 is sandwiched between the magnetoresistive sensing element 42 and the antiferromagnetic layer 46; a ferromagnetic soft adjacent layer 48 contacting the antiferromagnetic layer 46 such that the antiferromagnetic layer 46 is sandwiched between the nonmagnetic layer 44 and the soft adjacent layer 48, and a second antiferromagnetic layer 58 contacting the soft adjacent layer 48 such that the soft adjacent layer 48 is sandwiched between the first antiferromagnetic layer 46 and the second antiferromagnetic layer 58.

In one embodiment of the present invention, the magnetoresistive sensing element 42 is a magnetoresistive (AMR) sensing element comprising a soft ferromagnetic layer. In another embodiment of the invention, the magnetoresistive sensing element is giant magnetoresistive (GMR) sensing element comprising a plurality of layers. The design and manufacture of AMR sensing elements and GMR sensing elements are well known to those skilled in the art. Furthermore, the design and manufacture of nonmagnetic, SAL, and AFM layers are well known to those skilled in the art.

The combination of the AFM layer and the SAL layer, with the AFM layer being positioned between the SAL layer and the MR element, will be referred to herein as an AFM/SAL exchange biased bilayer or, simply, an "exchange biased bilayer." In the MR sensor 56 of FIG. 5, an exchange biased bilayer 53 is the combination of the AFM layer 46 and the SAL layer 48.

As noted above, the dual pinning layer structure of the present invention provides an enhanced pinning of the pinned layer compared to providing only a single pinning layer. Enhancing the pinning of the pinned layer, in turn, enhances the performance of the sensor.

Shown in broken lines in FIG. 5 is an optional additional SAL layer 59. This additional SAL layer forms a second exchange biased bilayer 53A from the AFM layer 58 and the SAL layer 59. Therefore, a multilayered structure AFM/SAL/AFM/SAL is formed from layers 46/48/58/59, respectively. Further exchange biased bilayers AFM/SAL can also be added, as in AFM/SAL/AFM/SAL AFM/SAL. . . . By providing multiple bilayers, the SAL layer can be made thin, e.g. 20–80 Angstroms, resulting in a high exchange field "$H_{ex}$" and high resistance "R" SAL layer, thereby reducing the shunting in the sensor.

Figure 6:
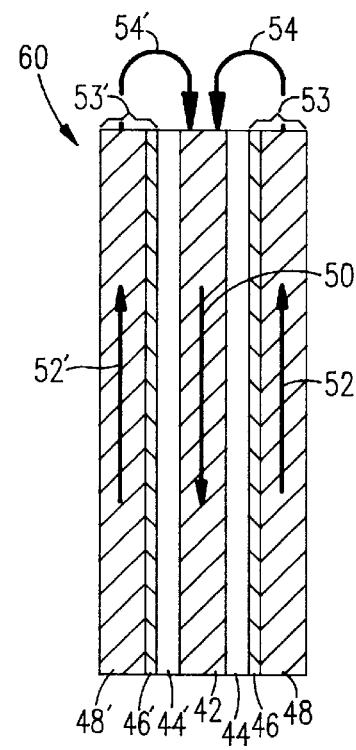
FIG. 6 is a cross sectional view of an improved MR sensor of the present invention with a symmetrical arrangement of the exchange biased bilayers and without the second AFM layer.

Another MR sensor 60 of the present invention is shown in FIG. 6. This design is a symmetrical version of the MR sensor 56 of FIG. 5 with the omission of the second antiferromagnetic layer 58, where symmetrical elements are indicated by a prime on the element numbers. As noted, this symmetrical design produces both the fringing field 54 from the SAL 48 and a fringing field 54' from the SAL 48'. The dual fringing fields provide a more uniform bias field and a large bias magnitude.

Figure 7:
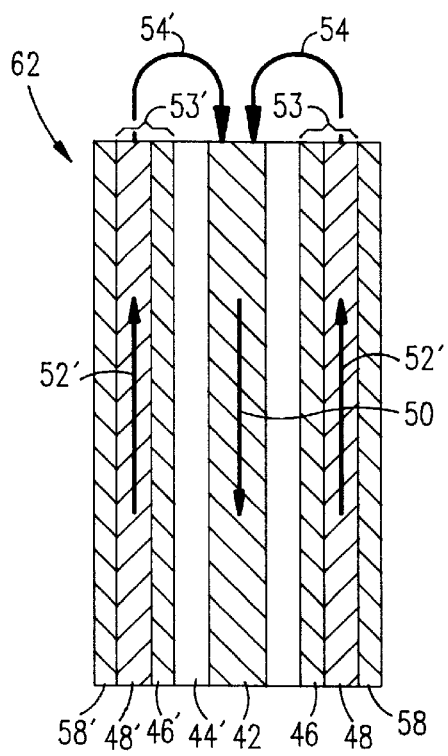
FIG. 7 is a cross sectional view of an improved MR sensor of the present invention similar to that of FIG. 5, but with a symmetrical arrangement of the exchange biased bilayers and the AFM layers.
Figure 8:
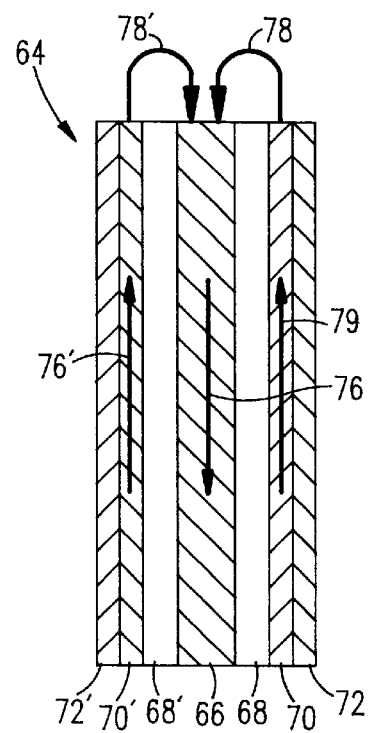
FIG. 8 is a cross sectional view of an improved MR sensor of the present invention having a symmetrical arrangement of AFM and SAL layers.

A still further MR sensor 62 of the present invention is shown in FIG. 7. This design is a symmetrical version of the MR sensor 56 of FIG. 5 including the second AFM layer 58, where symmetrical elements are indicated by a prime on the element numbers. Again, this symmetrical design produces both the fringing field 54 from the SAL 48 and a fringing field 54' from the SAL 48'. The dual fringing fields provide a more uniform bias field and a large bias magnitude, as before. In addition, the additional AFM layers 58 and 58' provide additional pinning for the SAL layers 48 and 48', as discussed previously. An alternate embodiment for an MR sensor 64 of the present invention is illustrated in FIG. 8. The MR sensor 64 is of symmetrical design (as were the MR sensors 60 of FIG. 6 and 62 of FIG. 7) but, in this instance, the position of the SAL layers and the AFM layers have been reversed. Therefore, the SAL and AFM layers do not form an exchange biased bilayer, as defined previously.

More particularly, the MR sensor 64 includes an MR sensing element 66, a nonmagnetic or "spacer" layer 68, a soft adjacent layer or "SAL" 70, and an antiferromagnetic or "AFM" layer 72. Since this is a symmetrical structure, the MR sensor further includes a symmetrically located (with respect to the MR sensing element 66) spacer layer 68', SAL layer 70', and AFM layer 72'. The AFM layer 72 is the pinning layer for the "pinned" SAL layer 70, while the AFM layer 72' is the pinning layer for the "pinned" SAL layer 70'. The magnetic field of the MR sensor 64 is shown by arrow 74, while the magnetic fields of the SAL layers 70 and 70' are shown by arrows 76 and 76', respectively. The fringing field from the pinned SAL layer 70 is shown by arrow 78, and the fringing field from the pinned SAL layer 70' is shown by the arrow 78'. The SAL layer will be in full saturation, and will not become unsaturated under normal operating conditions due to the very strong pinning effect described previously.

In the present invention, the soft adjacent layers (SALs) or "biasing" layers are made from a soft magnetic material with high magnetic moments. These materials include NiFeRh, NiFeNb or Co-based alloys. The biasing layers are exchange coupled with high resistivity or dielectric antiferromagnetic (AFM) layers such as FeMn, RhMn, IrMn, NiO or NiCoO. The nonmagnetic layers separating the AMR or GMR multilayer elements from the AFM layers are made from a nonmagnetic layer such as Ti or Ta.

The dimensions of the various layers are dependent upon the application. However, in the present invention, thickness of the nonmagnetic spacer layers is preferably in the range of 10 to 80 Angstroms. The thickness of the AFM layers is preferably in the range of 60 to 120 Angstroms. The thickness the SAL layers is preferably in the range of 30 to 100 Angstroms. The thickness of the MR elements are dependent upon the technology used for the sensing element.

To reduce the current shunting effect when providing a biasing current to the MR sensors, the AFM pinning films, the pinned SAL layers, and the nonmagnetic spacer materials should be insulating or be made from a material that has a higher resistivity (e.g. at least three times the resistivity) than the resistivity of the AMR or GMR ML sensing elements. The SAL should also have a very low magnetoresistive effect. The low biasing efficiency of a larger spacer (e.g. 280 Angstroms) between the AMR or GMR ML sensor and the SAL can be compensated by using a thinner SAL (e.g. less than 30 Angstroms) with high magnetic moment, such as the Co-based alloys. During the sensor deposition process, the oriented magnetic field can be applied to the transverse direction to achieve transverse pinning effect for SAL and the oriented field can be rotated later to 90 degrees when depositing AMR or GMR ML elements to induce the unidirectional anistotropy along the longitudinal direction (i.e. the current flow direction).

While this invention has been described in terms of several preferred embodiments, it is contemplated that alternatives, modifications, permutations and equivalents thereof will become apparent to those skilled in the art upon a reading of the specification and study of the drawings. It is therefore intended that the following appended claims include all such alternatives, modifications, permutations and equivalents as fall within the true spirit and scope of the present invention.

What is claimed is:

1. A magnetoresistive sensor comprising:
   a magnetoresistive sensing element;
   a first nonmagnetic layer contacting said magnetoresistive sensing element;
   a first antiferromagnetic layer contacting said first nonmagnetic layer such that said first nonmagnetic layer is sandwiched between said magnetoresistive sensing element and said first antiferromagnetic layer;
   a first ferromagnetic soft adjacent layer contacting said first antiferromagnetic layer such that said first antiferromagnetic layer is sandwiched between said nonmagnetic layer and said first soft adjacent layer;
   a second nonmagnetic layer contacting said magnetoresistive sensing element such that said magnetoresistive sensing element is sandwiched between said first nonmagnetic layer and said second nonmagnetic layer;
   a second antiferromagnetic layer contacting said second nonmagnetic layer such that said second nonmagnetic layer is sandwiched between said second antiferromagnetic layer and said magnetoresistive sensing element;
   a second ferromagnetic soft adjacent layer contacting said second antiferromagnetic layer such that said second antiferromagnetic layer is sandwiched between said second nonmagnetic layer and said second soft adjacent layer; and
   a third antiferromagnetic layer contacting said first soft adjacent layer such that said first soft adjacent layer is sandwiched between said first antiferromagnetic layer and said third antiferromagnetic layer.

2. A magnetoresistive sensor comprising:
   a magnetoresistive sensing element;
   a first nonmagnetic layer contacting said magnetoresistive sensing element;
   a first antiferromagnetic layer contacting said first nonmagnetic layer such that said first nonmagnetic layer is sandwiched between said magnetoresistive sensing element and said first antiferromagnetic layer;
   a first ferromagnetic soft adjacent layer contacting said first antiferromagnetic layer such that said first antiferromagnetic layer is sandwiched between said first nonmagnetic layer and said first soft adjacent layer;
   a second antiferromagnetic layer contacting said first soft adjacent layer such that said first soft adjacent layer is sandwiched between said first antiferromagnetic layer and said second antiferromagnetic layer;
   a second nonmagnetic layer contacting said magnetoresistive sensing element such that said magnetoresistive sensing element is sandwiched between said first nonmagnetic layer and said second nonmagnetic layer;
   a third antiferromagnetic layer contacting said second nonmagnetic layer such that said second nonmagnetic layer is sandwiched between said magnetoresistive sensing element and said third antiferromagnetic layer;
   a second ferromagnetic soft adjacent layer contacting said third antiferromagnetic layer such that said third antiferromagnetic layer is sandwiched between said second nonmagnetic layer and said second soft adjacent layer; and
   a fourth antiferromagnetic layer contacting said second soft adjacent layer such that said second soft adjacent layer is sandwiched between said third antiferromagnetic layer and said fourth antiferromagnetic layer.

3. A magnetoresistive sensor as recited in claim 2 wherein
   said first nonmagnetic layer and said second nonmagnetic layer are made from essentially the same material;
   said first antiferromagnetic layer, said second antiferromagnetic layer, said third antiferromagnetic layer, and said fourth antiferromagnetic layer are made from essentially the same material; and
   said first soft adjacent layer and said second soft adjacent layer are made from essentially the same material.

* * * * *